(12) United States Patent
Borrel et al.

(10) Patent No.: US 9,831,319 B2
(45) Date of Patent: Nov. 28, 2017

(54) TRANSISTOR WITH MIS CONNECTIONS AND FABRICATING PROCESS

(71) Applicant: Commissariat A L'Energie Atomique et aux Energies Alternatives, Paris (FR)

(72) Inventors: Julien Borrel, Seyssinet (FR); Louis Hutin, Saint Martin le Vinoux (FR); Yves Morand, Grenoble (FR); Fabrice Nemouchi, Moirans (FR); Heimanu Niebojewski, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/058,615

(22) Filed: Mar. 2, 2016

(65) Prior Publication Data
US 2016/0260819 A1 Sep. 8, 2016

(30) Foreign Application Priority Data
Mar. 3, 2015 (FR) ...................................... 15 51765

(51) Int. Cl.
*H01L 29/66* (2006.01)
*H01L 29/08* (2006.01)
(Continued)

(52) U.S. Cl.
CPC .. *H01L 29/66553* (2013.01); *H01L 21/76897* (2013.01); *H01L 23/535* (2013.01);
(Continued)

(58) Field of Classification Search
CPC ......... H01L 29/66553; H01L 21/76897; H01L 23/535; H01L 29/0895; H01L 29/42364;
(Continued)

(56) References Cited

U.S. PATENT DOCUMENTS

2003/0183820 A1* 10/2003 Park ................... H01L 29/41733
257/66
2010/0155846 A1* 6/2010 Mukherjee ........ H01L 21/28512
257/365
(Continued)

FOREIGN PATENT DOCUMENTS

WO WO 2012/087660 A2 6/2012

OTHER PUBLICATIONS

French Preliminary Search report dated Jan. 19, 2016, French Application 15 51765, filed on Mar. 3, 2015 ( with English Translation of Categories of Cited Documents and Written Opinion).
(Continued)

*Primary Examiner* — Cuong B Nguyen
(74) *Attorney, Agent, or Firm* — Oblon, McClelland, Maier & Neustadt, L.L.P.

(57) ABSTRACT

A field-effect transistor, including a source, drain and channel formed in a semiconductor layer a gate stack placed above the channel, including a metal electrode, a first layer of electrical insulator placed between the metal electrode and the channel, and a second layer of electrical insulator covering the metal electrode; a metal contact placed plumb with the source or drain and at least partially plumb with said gate stack; and a third layer of electrical insulator placed between said metal contact and said source or said drain.

14 Claims, 9 Drawing Sheets

(51) Int. Cl.
  *H01L 21/768* (2006.01)
  *H01L 23/535* (2006.01)
  *H01L 29/423* (2006.01)
  *H01L 29/51* (2006.01)
  *H01L 29/772* (2006.01)

(52) U.S. Cl.
  CPC .... *H01L 29/0895* (2013.01); *H01L 29/42364* (2013.01); *H01L 29/512* (2013.01); *H01L 29/772* (2013.01)

(58) Field of Classification Search
  CPC . H01L 29/512; H01L 29/772; H01L 29/7839; H01L 29/786; H01L 29/0653; H01L 29/41725; H01L 29/66643
  See application file for complete search history.

(56) References Cited

U.S. PATENT DOCUMENTS

| | | |
|---|---|---|
| 2012/0161321 A1 | 6/2012 | Haverty et al. |
| 2013/0069126 A1* | 3/2013 | Huang .............. H01L 29/41783 257/288 |
| 2013/0214289 A1* | 8/2013 | Mehrotra .......... H01L 29/66545 257/77 |
| 2014/0308812 A1 | 10/2014 | Arghavani et al. |

OTHER PUBLICATIONS

Randy W. Mann et al. "Silicides and local interconnections for high-performance VLSI applications", IBM Journal of Research and Development, 1995, pp. 403-417.

B. E. Coss et al. "Near band edge Schottky barrier height modulation using high-k dielectric dipole tuning mechanism", Applied Physics Letters, vol. 95, 2009, 3 pages.

Daniel Connelly et al. "A New Route to Zero-Barrier Metal Source/Drain MOSFETs", IEEE Transactions on Nanotechnology, vol. 3, No. 1, 2004, 7 pages.

Koji Kita et al. "Intrinsic Origin of Electric Dipoles Formed at High-k/SiO$_2$ Interface", Department of Materials Engineering, The university of Tokyo, 4 pages.

Brian E. Coss et al. "Contact Resistance Reduction to FinFET Source/Drain Using Novel Dielectric Dipole Schottky Barrier Height Modulation Method", IEEE Electron Device Letters, vol. 32, No. 7, 2011, 3 pages.

K.-W. Ang et al. "Effective Schottky Barrier Height Modulation using Dielectric Dipoles for Source/Drain Specific Contact Resistivity Improvement", IEEE, IEDM12-439, 2012, 4 pages.

Jenny Hu et al "Metal/III-V effective barrier height tuning using atomic layer deposition of high-k/high-k bilayer interfaces", Applied Physics Letters, vol. 99, 2011, 4 pages.

Louis Hutin et al. "Junction Technology Outlook for Sub-28nm FDSOI CMOS", 2014 International Workshop on Junction Technology (IWJT), 2014, 6 pages.

* cited by examiner

TRANSISTOR WITH MIS CONNECTIONS AND FABRICATING PROCESS

The invention relates to the formation of contacts between the metal of connection contacts and the source and drain of a MOS transistor, and in particular to the formation of metal-semiconductor connections ensuring a minimum interface contact resistance for the transistor and, more widely, a low access resistance.

In order to decrease the cost of integrated circuits and increase their performance, manufacturers have constantly decreased the size of transistors, increased their number per chip, and increased the number of circuits produced in parallel. To allow this increase in integrated-circuit performance, technologies have therefore geometrically decreased the size of the transistors of the active portion and the size of interconnections. However, these improvements amplify parasitic effects associated with the transistors, connections and interconnections.

External parasitic resistance is a major problem for the continued decrease in size of technological nodes. The contact or connection resistance between the metal and semiconductor is in particular a substantial limiting factor for future technological nodes, which require a smaller contact area.

One known process for forming a metal-semiconductor connection or contact consists in depositing a contact metal on the drain and source. An intermetallic compound is then formed between the semiconductor of the source or drain and the metal, with a view to decreasing contact resistance.

With sources and drains made for example of B-doped SiGe for pMOS and As-doped SiC for nMOS, it is tricky, with an NiPt contact metal, to control the properties of this intermetallic compound. In particular, its interface state, its temperature stability or the uniformity of its thickness are tricky to control.

With a view to solving these problems, it has been proposed to produce a connection with a dielectric-based contact generally designated by the acronym MIS. Specifically, it has been observed that a dielectric layer or bilayer between the interconnection metal and the semiconductor allows non-alloyed connections or contacts to be produced while controlling the Schottky barrier height formed in the semiconductor.

The decrease in the density of interface states induced by the insertion of the dielectric allows the Fermi level to be unpinned and therefore the Schottky barrier height to be decreased.

Figure 26:
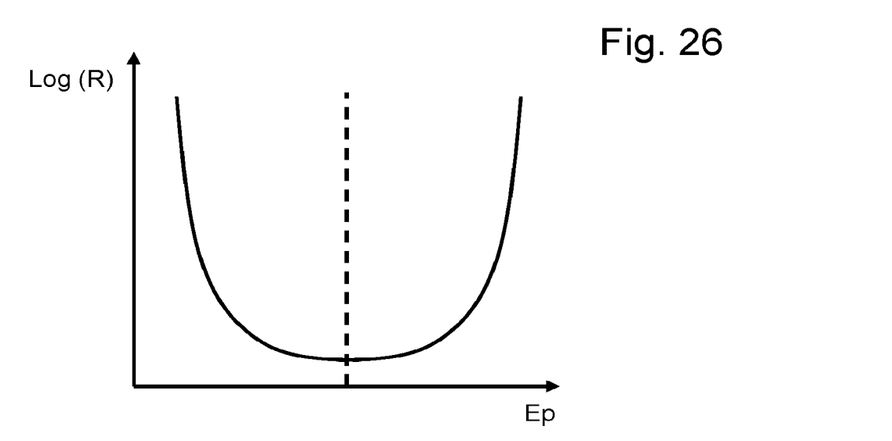
FIG. 26 is a graph illustrating an exemplary MIS connection resistivity, as a function of its thickness.

However, this insertion has the drawback of generating a thickness-dependent tunnelling resistance. The optimal thickness is therefore that at which competition between these two effects produces the lowest possible specific resistance, as illustrated by the schematic graph in FIG. 26. FIG. 26 illustrates contact resistance as a function of the thickness of the dielectric layer. In the left-hand portion, interface-state density has a preponderant influence on this resistance. In the right-hand portion, tunnelling resistance is preponderant.

The energy that separates the valence band and conduction band is usually called bandgap. In order to evaluate this optimal thickness, two preponderant parameters must be taken into account: the bandgap of the dielectric, and the offset between the valence band of the dielectric and the valence band of the semiconductor if the latter is p-type, or the offset between the conduction band of the dielectric and the conduction band of the semiconductor if the latter is n-type.

The bandgap of the dielectric determines the extent to which the Fermi level is unpinned. For a given thickness, the higher its value the greater the unpinning. The offset of the conduction or valence bands determines the tunnelling resistance induced by the dielectric. The higher its value, the higher the tunnelling resistance.

With an n-type source and drain, it is especially known to use a 1.2 nm-thick $La_2O_3$ dielectric. With a p-type source and drain, it is especially known to use a 1.1 nm-thick $TiO_2$ dielectric.

To further decrease the connection or contact resistance, it has been proposed to produce a connection using a double dielectric layer generally designated by the acronym MIIS.

The use, as a dielectric, of a double oxide layer allows the Schottky barrier height to be decreased and/or inverted under the effect of dipoles induced by the oxide/oxide interface, thereby decreasing contact resistance.

When two oxides are stuck together and have different oxygen densities per unit area, $O^{2-}$ anions diffuse under the effect of the oxygen concentration gradient. These anions leave $Vo^{2+}$ voids behind them. Charges of opposite sign are therefore generated on either side of the interface between the oxide layers, thus creating dipoles that may decrease the Schottky barrier height.

Two families of bilayers may be considered:
- The association of $SiO_2$ with oxides having a higher oxygen density per unit area leads to the appearance of what are called "p-type" dipoles, allowing the Schottky barrier height to be decreased in p-type semiconductors.
- The association of $SiO_2$ with oxides having a lower oxygen density per unit area leads to the appearance of what are called "n-type" dipoles, allowing the Schottky barrier height to be decreased in n-type semiconductors.

To decrease source and drain access resistance, it is also known to silicide them. Silicidation may however affect the channel of the transistor and its industrialisation poses many problems, in particular for technological nodes of 28 nm and below, and in particular for FDSOI technologies. For field-effect transistors, it is therefore possible that it might be necessary to use a non-silicided source and drain. Because of the dispersion in the photolithography steps of the process for fabricating the transistor, design rules require a certain spacing to be preserved between the gate stack and the metal contacts of the source and drain. This distance increases the conduction length through a non-silicided source and drain, thereby engendering a non-negligible access resistance between the channel and source and drain.

Document US 2014/0308812 describes a device and a process for fabricating an interconnection structure for transistor ohmic contacts. MIS contacts are formed on the source and drain.

The document published by Randy W Mann, entitled "Silicides and local interconnections for high-performance VLSI applications" in the IBM Journal of Research and Development, 1 Jul. 1995, on pages 403-417, describes examples of processes for forming transistor interconnections.

The document published by Coss, entitled "Near band edge the Schottky barrier height modulation using high-Î dielectric dipole tuning mechanism" in Applied Physics Letters, American Institute of Physics, volume 95, No 22, pages 222105-222105, describes interfacial dielectric layers for forming MIS source and drain contacts.

There is therefore a need for a field-effect transistor and an associated fabricating process allowing low access and contact resistances to be ensured. The invention aims to resolve one or more of these drawbacks. The invention thus relates to a field-effect transistor, such as defined in the appended claims.

The invention also relates to a process for fabricating a field-effect transistor, such as defined in the appended claims.

Those skilled in the art will understand that each of the features of the dependent claims may be combined independently with the features of the independent claims, without, for all that, constituting an intermediate generalization.

Other features and advantages of the invention will become more clearly apparent from the description thereof that is given below by way of nonlimiting indication and with reference to the appended drawings, in which.

Figure 1:
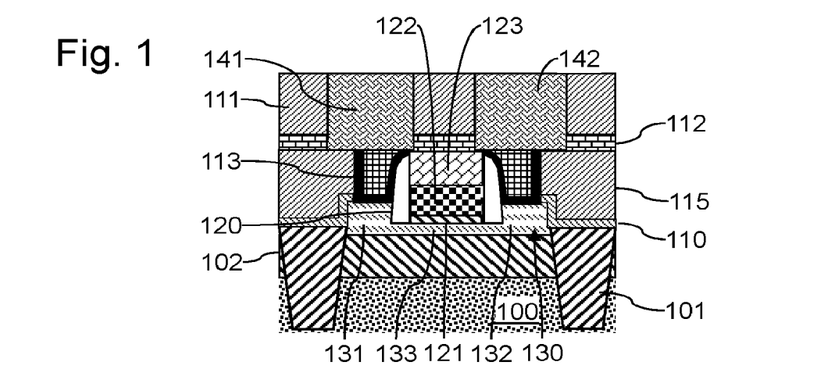
FIG. 1 is a cross-sectional view of an example of a first embodiment of an FDSOI transistor according to the invention.

FIG. 1 is a cross-sectional view of an exemplary FDSOI transistor 1 according to an example of a first embodiment of the invention. The transistor 1 includes, as is known per se, a semiconductor substrate 100 surmounted by a buried insulating layer 102.

The buried insulating layer 102 is surmounted by a silicon-based semiconductor element 130. The semiconductor element 130 is typically produced in a semiconductor layer usually designated by the term "active layer". A source 131, drain 132 and channel 133 are produced in the element 130. The channel 133 extends between the source 131 and the drain 132. For an FDSOI transistor 1, the channel 133 typically has a doping lower than $5 \times 10^{15}$ cm$^{-3}$; and typically of about $10^{15}$ cm$^{-3}$. The channel 133 for example has a thickness comprised between 3 and 15 nm.

The transistor 1 includes a gate stack placed above the channel 133. The gate stack includes:
a gate electrical insulator 121;
a gate metal electrode 122, the electrical insulator 121 being placed between the electrode 122 and the channel 133; and
an electrical insulator 123 for protecting the gate electrode 122, this insulator 123 covering the gate electrode 122.

Spacers 120 are advantageously placed on either side laterally relative to the gate electrical insulator 121, relative to the gate electrode 122 and relative to the protective insulator 123.

Metal contacts 141 and 142 are placed plumb with the source 131 and drain 132, respectively. The metal contacts 141 and 142 extend continuously as far as to plumb with the gate stack. In the embodiment illustrated, the metal contacts 141 and 142 are placed at least partially plumb with respective spacers 120.

A layer of electrical insulator 113 is here placed between the metal contact 141 and the source 131, on the one hand, and between the metal contact 142 and drain 132, on the other hand.

The protective insulator 123 makes it possible to avoid a short-circuit between the gate electrode 122 and the contact 141 or the contact 142, despite the fact that these contacts 141 and 142 extend to plumb with the gate stack. Thus, operation of the transistor 1 is not adversely affected by possible dispersion in the positions of the contacts 141 and 142 relative to the gate stack. The positions of the contacts 141 and 142 guarantee minimum distances between the channel 133 on the one hand and the source 131 and drain 132 on the other hand, thereby allowing the conduction resistance and therefore the access resistance of the transistor 1 to be decreased.

Thus, even if a source 131 and a drain 132 that are not silicided (and that thus have a resistivity that is potentially very much higher than that of a silicided drain or source) are used, the improvement in contact resistance obtained via the insulator 113 remains significant. Moreover, the presence of the insulator 113 makes it possible to prevent intermetallic compounds from forming in the source 131 and drain 132 by diffusion of the metal of the contacts 141 and 142.

Moreover, it may be noted that the transistors thus formed have a relatively narrow dispersion in respect of conduction resistance (contributing to the access resistance between their contacts and the channel). Specifically, whatever the extent of the superposition of a contact on the gate stack, the conduction distance through the source or drain remains identical because it is defined by the position of the external edge of a spacer against which the contact thereof is formed.

Because it uses a non-silicided source 131 and drain 132, the fabricating process of the transistor 1 is more easily industrializable, as there is a decrease in the number of different materials to be used, which are tricky to administer for transistors of very small size.

In the illustrated embodiment, the layer of electrical insulator 113 at least partially covers the gate stack. The electrical insulator 113 here covers the upper portion of the spacers 120, without completely covering the protective insulator 123.

The electrical insulator 113 may be adapted to MIIS connections by including, as is known per se, two insulating films (not detailed in the figures) made of different and superposed materials.

This first embodiment aims to minimize parasitic capacitances at the level of the contacts 141 and 142, by limiting the lateral area covered by the electrical insulator 113.

The transistor 1 optionally includes trench isolations 101 placed on either side of the assembly comprising the source 131, drain 132 and gate stack. The trench isolations 101 are used to isolate the transistor 1 from surrounding circuits. The trench isolations 101, which are frequently designated by the acronym STI, here pass through the buried insulating layer 102 and extend as far as into the substrate 100. The trench isolations 101 are for example made of silicon oxide.

An etch stop layer 110 here covers the edges of the element 130. The etch stop layer 110 here extends over the trench isolations 101, and as far as the upper portion of the semiconductor element 130. The etch stop layer 110 has a composition known per se. The etch stop layer 110 may for example be made of SiN. This layer 110 may for example have a thickness comprised between 5 nm and 100 nm and typically of 20 nm. The transistor 1 here includes an encapsulating layer 115 covering the etch stop layer 110. The transistor 1 here furthermore includes an etch stop layer 112 placed on the gate stack and the encapsulating layer 115. An encapsulating layer 111 is placed on the etch stop layer 112.

The electrical insulator 113 here makes contact with lateral faces delimited in the encapsulating layer 115. The electrical insulator 113 here also makes contact with a lateral border of the etch stop layer 110.

The gate stack for example has a height comprised between 10 and 100 nm and for example of 30 nm.

The gate insulator 121 typically has a thickness comprised between 0.5 and 8 nm, preferably between 1 and 3 nm and for example of 2 nm. The gate insulator 121 is for example made of silicon oxide.

The gate electrode 122 is for example a superposition of a layer of polysilicon (for example FG polysilicon chosen from the group comprising NiSi, NiPtSi, NiCoSi, $TiSi_2$ and WSi) and a metal layer for a gate-first type integration or for example a metal layer for a gate-last type integration. The metal of the electrode 122 may for example be chosen from the group including TiN, TiAlN or TaN.

Advantageously, the thickness of the protective insulator 123 is at least equal to half the gate length Lg. The protective insulator 123 may for example be chosen from the group comprising SiN, BN, SiBCN or SiBN.

Advantageously, the encapsulating layer 115 is made of silicon oxide.

The insulating layer 113 must be thick enough to limit interface state density. The insulating layer 113 must also be thin enough not to excessively increase the resistance to conduction by the tunnelling effect.

The insulating layer 113 advantageously has a thickness at least equal to 0.8 nm and preferably at least equal to 1 nm. The insulating layer 113 advantageously has a thickness at most equal to 3 nm and preferably at most equal to 2.5 nm.

For an insulating layer 113 formed from a single uniform layer, it is for example possible to envisage using:

$La_2O_3$ for an n-type source 131 and drain 132. The thickness of this layer 113 is for example comprised between 1 and 1.5 nm, and for example 1.2 nm; and $TiO_2$ for a p-type source 131 and drain 132. The thickness of this layer 113 is for example comprised between 1 and 1.5 nm, and for example 1.1 nm.

For an insulating layer 113 formed from a stack of insulating layers, it is possible for example to envisage using:

$SiO_2$ on a lanthanum oxide, or $TiO_2$ on $Al_2O_3$ for an n-type source 131 and drain 132. The thickness of this layer 113 is for example comprised between 1.5 and 2.5 nm, and for example 2 nm. It is possible for example to superpose a 1 nm layer of $SiO_2$ on a 1 nm layer of lanthanum oxide, or a 1.3 nm layer of $TiO_2$ on a 0.7 nm layer of $Al_2O_3$; and $SiO_2$ on an aluminium oxide for a p-type source 131 and drain 132. The thickness of this layer 113 is for example comprised between 1.5 and 2.5 nm, and for example 2 nm. It is possible for example to superpose a 1 nm layer of $SiO_2$ on a 1 nm layer of aluminium oxide.

The etch stop layer 112 may for example be made of SiN. This layer 112 may for example have a thickness comprised between 5 nm and 100 nm and typically of 20 nm.

The encapsulating layer 111 may for example be made of silicon oxide or of a low-permittivity carbon-containing derivative. The encapsulating layer 111 may for example have a thickness comprised between 50 nm and 500 nm, typically 100 nm.

FIGS. 2 to 16 illustrate various steps of an exemplary process for fabricating a transistor 1 according to the first embodiment of the invention.

Figure 2:
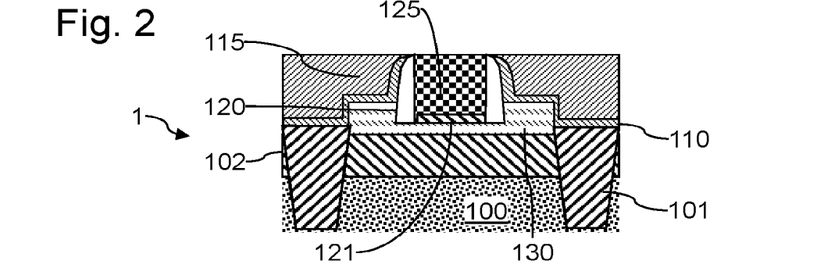
FIGS. 2 to 16 are schematic cross-sectional views of the transistor in FIG. 1 at various stages of an exemplary fabricating process.

In the initial configuration illustrated in FIG. 2, a component that is a precursor of the transistor 1 is provided, comprising: a substrate 100 such as described above; a buried insulating layer 102 such as described above; trench isolations 101 such as described above; a semiconductor element 130 such as described above; and a gate stack including spacers 120 and a gate insulator 121 such as described above.

A metal pad 125 is produced on the gate oxide 121, between the spacers 120. The upper end of the pad 125 is flush. An etch stop layer 110 extends as far as the upper end of the spacers 120. The etch stop layer is covered with an encapsulating layer 115.

Figure 3:
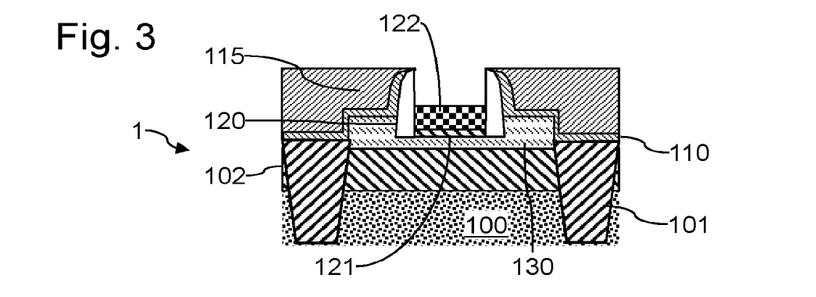

In the configuration in FIG. 3, an upper portion of the metal pad 125 has been subjected to a partial selective removal, to allow the gate electrode 122 to be formed.

It may for example be envisaged to remove between 20 and 80% of the initial height of the metal pad 125, for example 50% of this initial height.

The selective removal may be carried out by a partial wet etching step (for example with TMAH for polysilicon) or a partial dry etching step (plasma etching for example). Such an etch is selective over the material of the spacers 120 or of the encapsulating layer 115 for example.

Optionally, in the particular case of a pad 125 including an FG polysilicon layer, the gate electrode 122 may be subjected to a silicided step, in order for example to form a silicide chosen from the group comprising NiSi, NiPtSi, NiCoSi, $TiSi_2$ and WSi.

Figure 4:
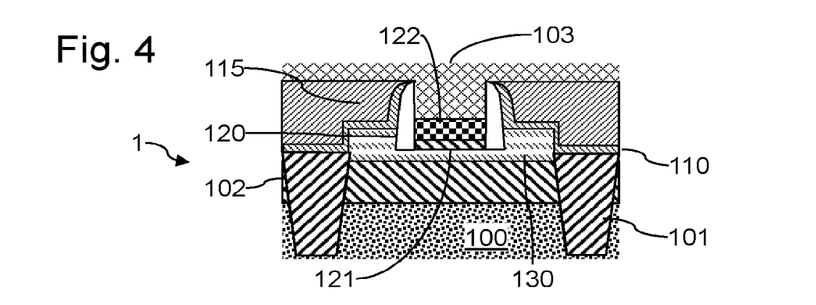

In the configuration in FIG. 4, a layer 103 of insulator has been formed. The layer 103 especially fills the volume removed from the pad 125 during the selective removing step. The layer 103 may be formed by various processes such as PECVD, LPCVD or ALD. In order to guarantee the removed volume of pad 125 is filled, the layer 103 is deposited so as to also cover the encapsulating layer 115.

Figure 5:
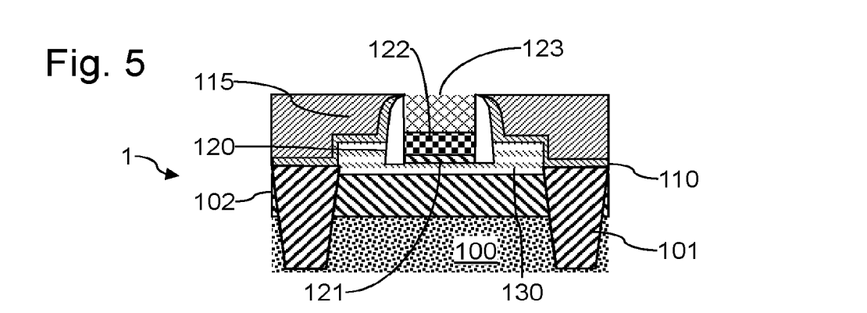

In the configuration in FIG. 5, the excess of the layer 103 is removed until the encapsulating layer 115 is exposed. This removal is typically carried out by chemical-mechanical polishing (CMP). Such a polish may advantageously be implemented with a selectivity over materials other than that of the layer 103. After the removal, the layer 103 is preserved only in the gate stack, a protective insulator 123 thus being formed.

Figure 6:
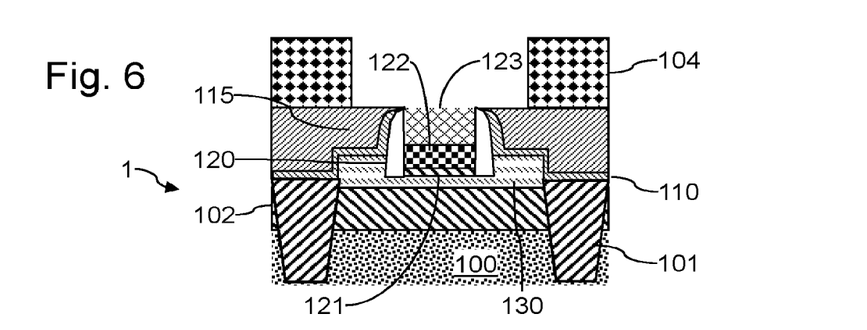

In the configuration in FIG. 6, a mask 104 has been formed on the encapsulating layer 115, by photolithography of a resist for example. The mask 104 is apertured to expose the gate stack and zones of the encapsulating layer 115 plumb with the source 131 and drain 132. The aperture produced by photolithography in the mask 104 thus has a relatively large size relative to the scale of the transistor 1 to be formed.

Figure 7:
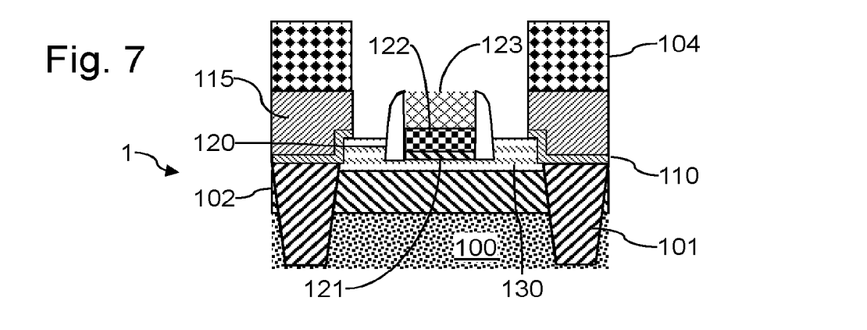

In the configuration in FIG. 7, the encapsulating layer 115 and the etch stop layer 110 have been removed plumb with the source 131, the drain 132 and the gate stack. This removal transfers the pattern defined by the aperture in the mask 104. The removal advantageously includes:

a first etching step in which the encapsulating layer is etched selectively over the other materials (in particular the materials of the spacers 120 and the protective insulator 123). This etching is for example anisotropic, and its properties are known per se by those skilled in the art. This etching is stopped after the encapsulating layer 115 has been removed plumb with the etch stop layer 110; and a second etching step in which the etch stop layer 110 is etched selectively over the other materials. This etching is for example anisotropic, and its properties are known per se by those skilled in the art. This etching is stopped after the etch stop layer 110 has been removed from the source 131, drain 132 and spacers 120. Grooves are thus formed plumb with the source 131 and drain 132, between the encapsulating layer 115 and the spacers 120. Said grooves have a typical depth of 20 nm.

Figure 8:
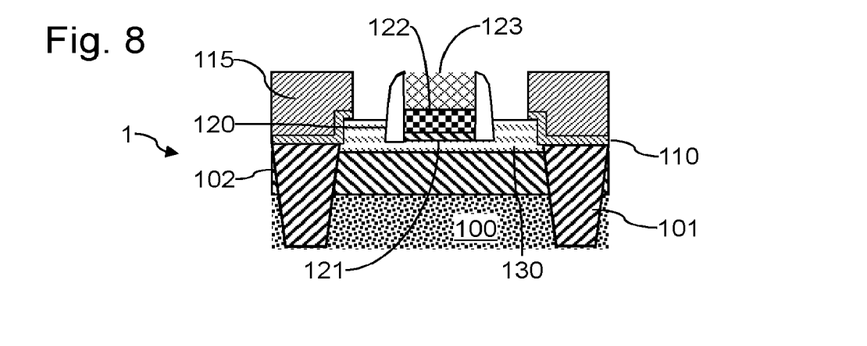

In the configuration in FIG. 8, the mask 104 has been removed by a process known per se. The removal of the mask 104 exposes the top face of the encapsulating layer 115.

Figure 9:
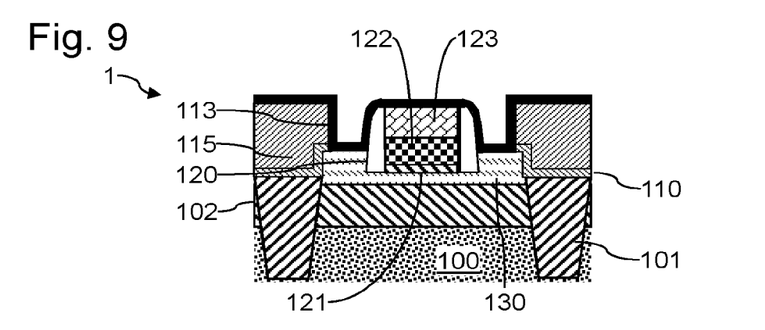

In the configuration in FIG. 9, the electrical insulator 113 has been formed over the entire wafer. The electrical insulator 113 thus covers the gate stack, the source 131, the drain 132 and the upper and side walls of the encapsulating layer 115. The electrical insulator 113 may be obtained either by forming a single insulating layer, or by forming a superposition of insulating layers. The parameters to be used to form the aforementioned insulating materials 113 are known per se by those skilled in the art.

Figure 10:
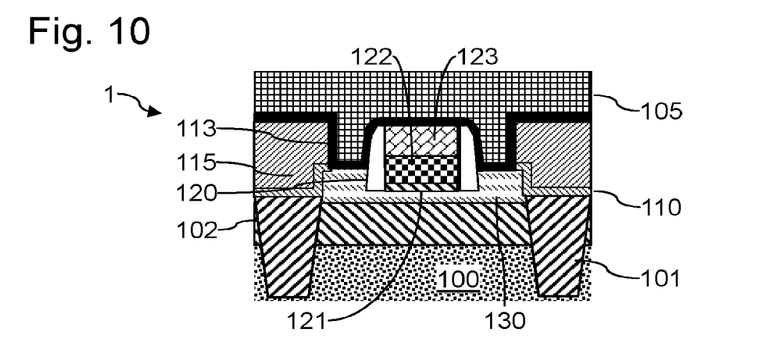

In the configuration in FIG. 10, a metal layer 105 is formed over the entire wafer in order to cover the insulator 113 and fill the grooves produced plumb with the source 131 and drain 132.

The metal layer 105 may include one layer, or a plurality of superposed layers of different metals. The one or more metals of these layers may for example be chosen from the group comprising TiN, TaN, TiAlN, W or Cu.

Figure 11:
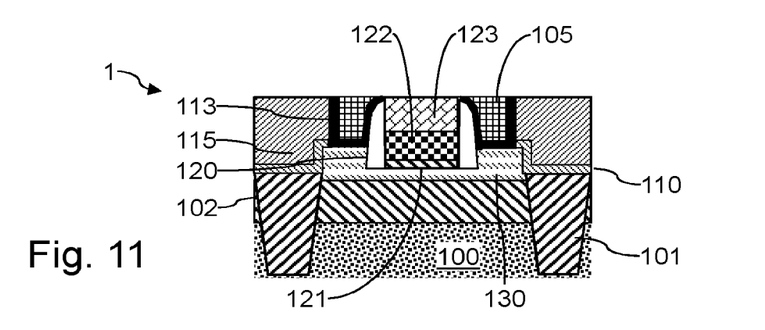

In the configuration in FIG. 11, the excess of the layer 105 is removed and a portion of the insulating layer 113 is removed, thereby exposing the upper face of the encapsulating layer 115 and exposing the protective insulator 123 (so as to prevent short-circuiting between the source 131 and the drain 132 above the gate stack). This removal is typically carried out by chemical-mechanical polishing (CMP). A large enough thickness of protective insulator 123 is also preserved to guarantee an absence of short-circuits between the gate electrode 122 and the source and drain contacts. After the removal, the layer 105 is preserved only in the grooves delimited by the insulating layer 113. A lower portion of the source and drain contacts is thus formed.

Figure 12:
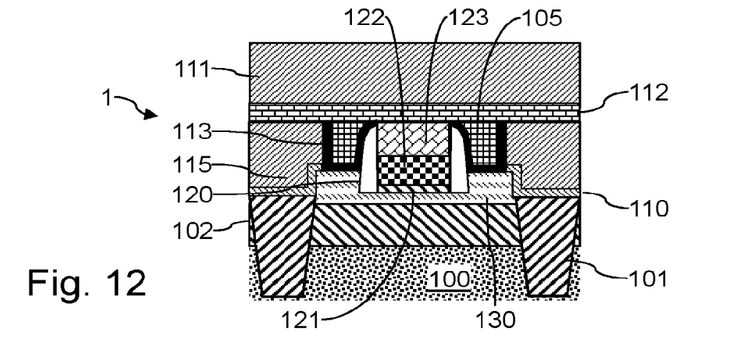

In the configuration in FIG. 12, the following have been formed:
  an etch stop layer 112, over the entire wafer; and
  an encapsulating layer 111, over the entire wafer, on the etch stop layer 112.

Figure 13:
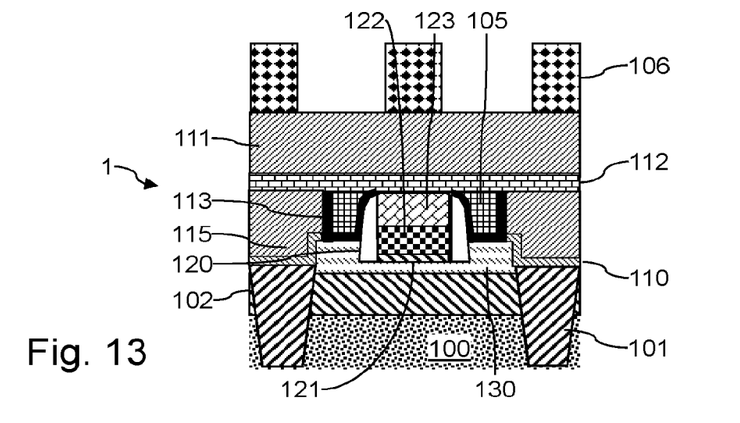

In the configuration in FIG. 13, a mask 106 has been formed on the encapsulating layer 111, by photolithography of a resist for example. The mask 106 is apertured in order to expose the encapsulating layer 111 plumb with the source 131 and drain 132. The apertures are larger than the source and drain, so as to make it easier to position them plumb with the source and drain even when photolithography tolerances are low. The dispersion in the positions of the apertures in the mask 106 relative to the source 131 and drain 132 may be relatively large (for example about 0.5*Lg) without adversely affecting the operation of the transistor 1, because it is possible subsequently to deposit the metal of a contact on the protective insulator 123 without running the risk of generating a short-circuit.

Figure 14:
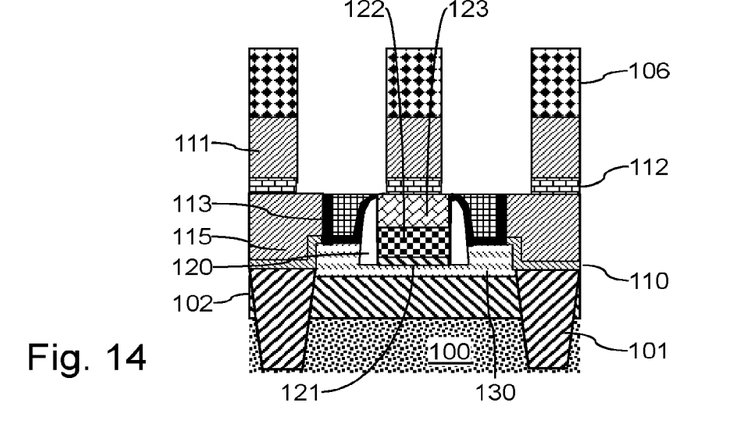

In the configuration in FIG. 14, the encapsulating layer 111 and the etch stop layer 112 have been removed plumb with the source 131 and drain 132. This removal here transfers the pattern defined by the apertures in the mask 106. Because the apertures in the mask 106 are larger than the source 131 and than the drain 132, the removal here especially exposes a portion of the upper surface of the encapsulating layer 115 and/or a portion of the protective insulator 123.

The removal advantageously includes:
  a first etching step in which the encapsulating layer 111 is etched selectively over the other materials (in particular the material of the etch stop layer 112). This etching is for example anisotropic, and its properties are known per se by those skilled in the art. This etching is stopped after the encapsulating layer 111 has been removed plumb with the etch stop layer 112; and
  a second etching step in which the etch stop layer 112 is etched selectively over the other materials. This etching is for example anisotropic, and its properties are known per se by those skilled in the art. This etching is stopped after the etch stop layer 112 has been removed from the source 131, drain 132 and spacers 120 and a portion of the upper surface of the encapsulating layer 115. Grooves are thus formed plumb with the source 131 and drain 132, and plumb with a portion of the encapsulating layer 115, the spacers 120 and possibly a portion of the protective insulator 123.

Figure 15:
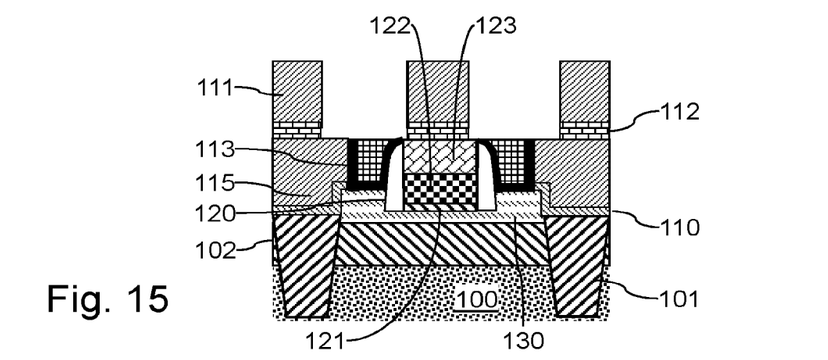

In the configuration in FIG. 15, the mask 106 has been removed by a process known per se. Removal of the mask 106 exposes the upper face of the encapsulating layer 111.

Figure 16:
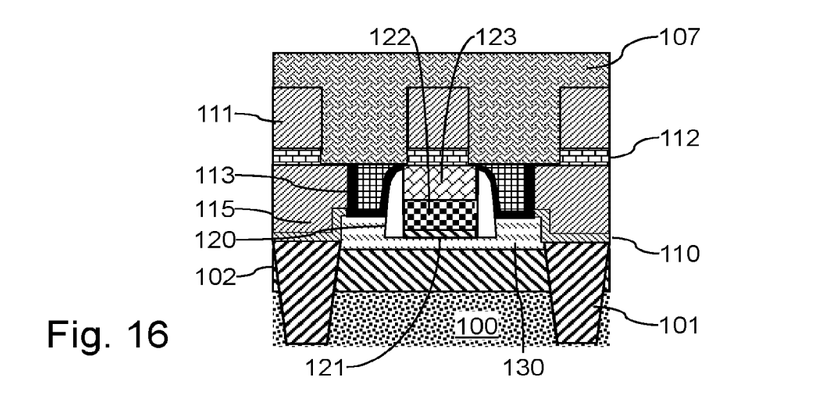

In the configuration in FIG. 16, a metal layer 107 is formed on the whole wafer in order to cover the various zones and fill the grooves produced plumb with the source 131 and drain 132 above the already present metal. The metal layer 107 formed makes contact with the lower portion of the contacts (which was formed during the preceding steps) and allows electrical conduction with these contacts.

The metal layer 107 may include one layer, or a plurality of superposed layers of different metals. The one or more metals of these layers may for example be chosen from the group comprising TiN, TaN, TiAlN, W or Cu. In the variant illustrated in FIG. 16, the material of the metal layer 107 is different from the metal already present.

Via a step of removing the excess of the metal layer 107 until the upper face of the encapsulating layer 111 is exposed, the structure illustrated in FIG. 1 is obtained. This removal is typically carried out by a chemical-mechanical polishing (CMP). The contacts 141 and 142 are thus formed.

The contacts 141 and 142 obtained after this removing step may typically have a thickness comprised between 20 and 500 nm and for example of 100 nm.

Interconnecting steps known per se may then be implemented to connect the contacts 141 and 142 of the transistor 1 to other circuits.

Figure 17:
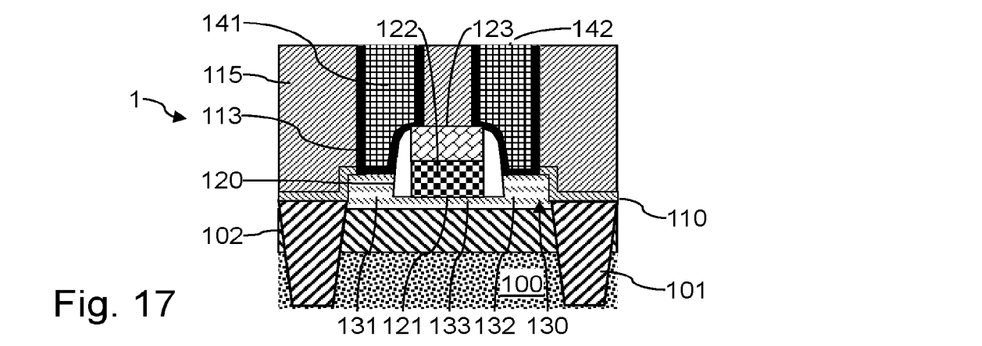
FIG. 17 is a cross-sectional view of an example of a second embodiment of an FDSOI transistor according to the invention.

FIG. 17 is a cross-sectional view of an exemplary FDSOI transistor 1 according to an example of a second embodiment of the invention. The transistor 1 includes, as is known per se, a semiconductor substrate 100 surmounted by a buried insulating layer 102.

The buried insulating layer 102 is surmounted by a silicon-based semiconductor element 130 here having the same structure as in the first embodiment. A source 131, drain 132 and channel 133 are thus produced in the element 130. The transistor 1 includes a gate stack placed above the channel 133 and here having the same structure as in the first embodiment. The gate stack therefore here includes a gate electrical insulator 121, a gate electrode 122, and an electrical insulator 123 for protecting the gate electrode 122. Spacers 120 are advantageously placed on either side laterally relative to the gate electrical insulator 121, relative to the gate electrode 122 and relative to the protective insulator 123.

Metal contacts 141 and 142 are placed plumb with the source 131 and drain 132, respectively. The metal contacts 141 and 142 extend continuously as far as to plumb with the gate stack. In the embodiment illustrated, the metal contacts 141 and 142 are placed at least partially plumb with respective spacers 120.

A layer of electrical insulator 113 is here placed between the metal contact 141 and the source 131, on the one hand, and between the metal contact 142 and drain 132, on the other hand.

As in the first embodiment, the protective insulator 123 makes it possible to avoid a short-circuit between the gate electrode 122 and the contact 141 or the contact 142, despite the fact that these contacts 141 and 142 extend to plumb with the gate stack. Thus, operation of the transistor 1 is again not adversely affected by possible dispersion in the positions of the contacts 141 and 142 relative to the gate stack. The positions of the contacts 141 and 142 guarantee minimum distances between the channel 133 on the one hand and the source 131 and drain 132 on the other hand, thereby allowing the conduction resistance of the transistor 1 to be decreased.

As for the first embodiment, the source 131 and drain 132 are advantageously not silicided (in order to facilitate industrialization of the transistor 1), the improvement in contact resistance obtained via the insulator 113 remaining significant because of the implementation of the invention. The presence of the insulator 113 also makes it possible to prevent intermetallic compounds from forming in the source 131 and drain 132 by diffusion of the metal of the contacts 141 and 142.

Moreover, the transistors thus formed have relatively narrow dispersions in their access resistance.

In the implementation of the illustrated embodiment, the layer of electrical insulator 113 at least partially covers the gate stack. The electrical insulator 113 here covers the upper portion of the spacers 120, without completely covering the protective insulator 123.

The electrical insulator 113 may be adapted to MIIS connections by including, as is known per se, two insulating films (not detailed in the figures) made of different and superposed materials.

This second embodiment aims to simplify the process for fabricating the transistor 1 especially by minimizing the number of process steps and in particular photolithography and/or deposition steps.

The transistor 1 optionally includes trench isolations 101 having the same structure as in the first embodiment.

An etch stop layer 110 here covers the edges of the element 130. The etch stop layer 110 here extends over the trench isolations 101, and as far as the upper portion of the semiconductor element 130. The etch stop layer 110 has a composition known per se. The transistor 1 here includes an encapsulating layer 115 covering the etch stop layer 110.

The electrical insulator 113 here makes contact with lateral faces delimited in the encapsulating layer 115. The electrical insulator 113 here also makes contact with a lateral border of the etch stop layer 110.

FIGS. 18 to 25 illustrate various steps of an exemplary process for fabricating a transistor 1 according to the second embodiment of the invention. The steps illustrated with reference to FIGS. 18 to 21 may be identical to those described for the first embodiment.

Figure 18:
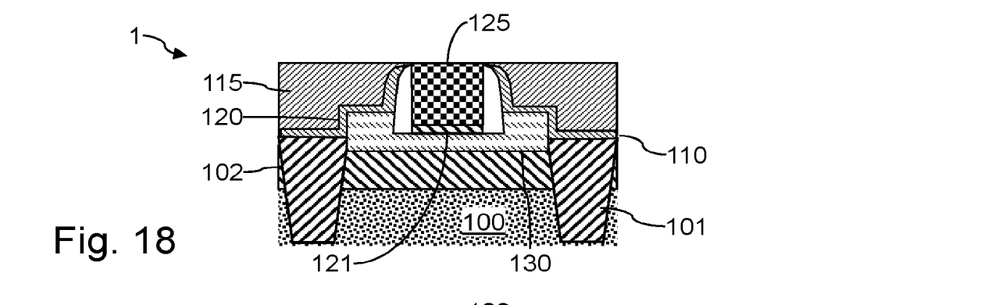
FIGS. 18 to 25 are schematic cross-sectional views of the transistor in FIG. 17 at various stages of an exemplary fabricating process.

In the initial configuration illustrated in FIG. 18, a component that is a precursor of the transistor 1 is provided, comprising: a substrate 100 such as described above; a buried insulating layer 102 such as described above; trench isolations 101 such as described above; a semiconductor element 130 such as described above; and a gate stack including spacers 120 and a gate insulator 121 such as described above.

A metal pad 125 is produced on the gate oxide 121, between the spacers 120. The upper end of the pad 125 is flush. An etch stop layer 110 extends as far as the upper end of the spacers 120. The etch stop layer is covered with an encapsulating layer 115.

Figure 19:
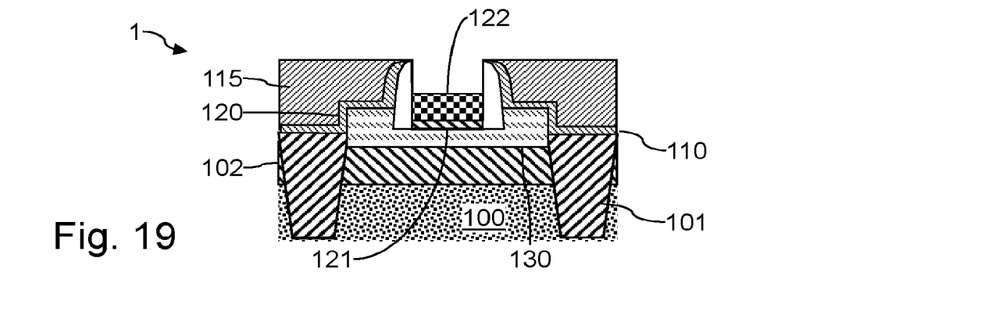

In the configuration in FIG. 9, the upper portion of the metal pad 125 has been subjected to a partial selective removal, to allow the gate electrode 122 to be formed.

Figure 20:
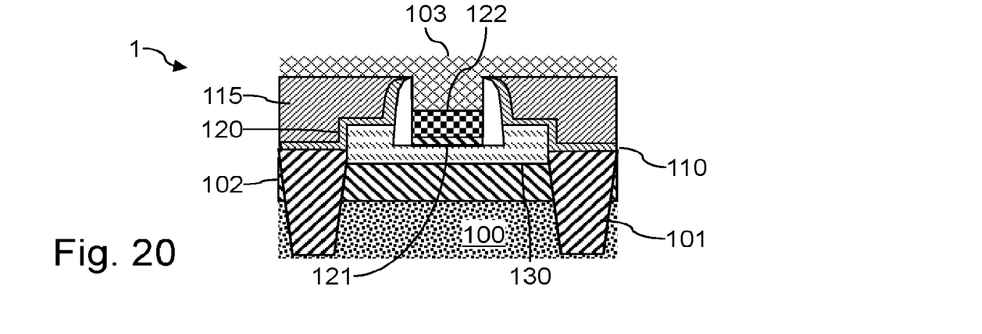

In the configuration in FIG. 20, a layer 103 of insulator has been formed. The layer 103 especially fills the volume removed from the pad 125 during the selective removing step. In order to guarantee the removed volume of pad 125 is filled, the layer 103 is deposited so as to also cover the encapsulating layer 115.

Figure 21:
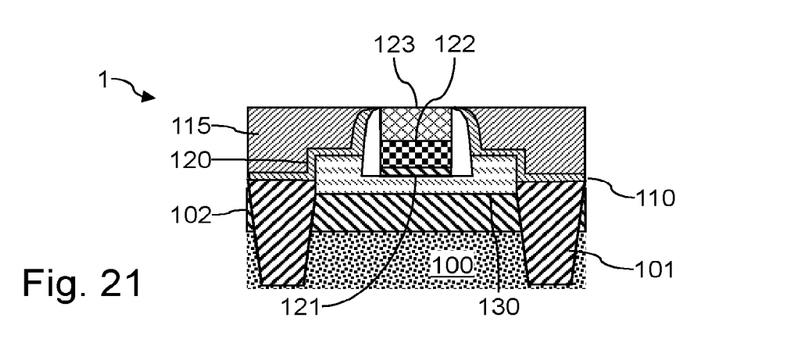

In the configuration in FIG. 21, the excess of the layer 103 is removed until the encapsulating layer 115 is exposed. After the removal, the layer 103 is preserved only in the gate stack, a protective insulator 123 thus being formed.

Figure 22:
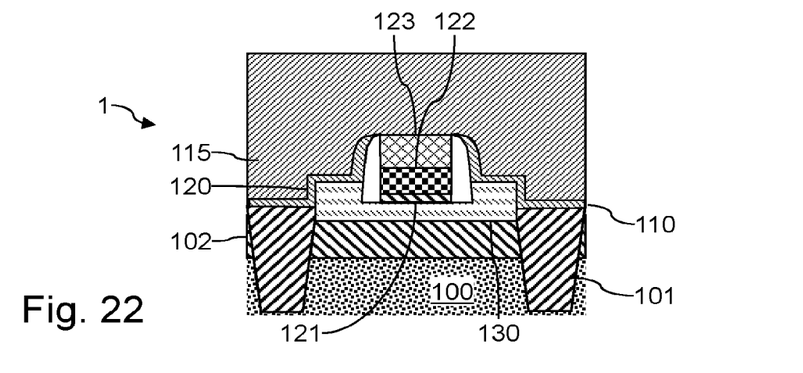

In the configuration in FIG. 22 an encapsulating layer has been formed on the gate stack and on the already present encapsulating layer 115. For the sake of simplicity, a single encapsulating layer 115 has been illustrated.

Figure 23:
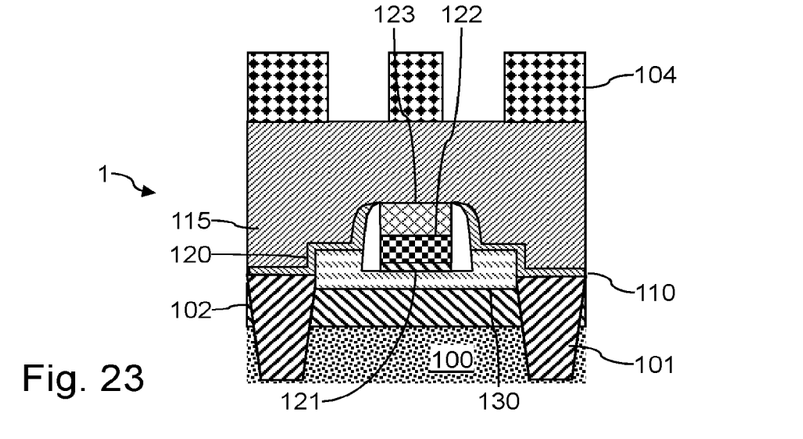

In the configuration in FIG. 23, a mask 104 has been formed on the encapsulating layer 115, by photolithography of a resist for example. The mask 104 is apertured to expose zones of the encapsulating layer 115 plumb with the source 131 and drain 132. The mask 104 here covers most of the gate stack.

Figure 24:
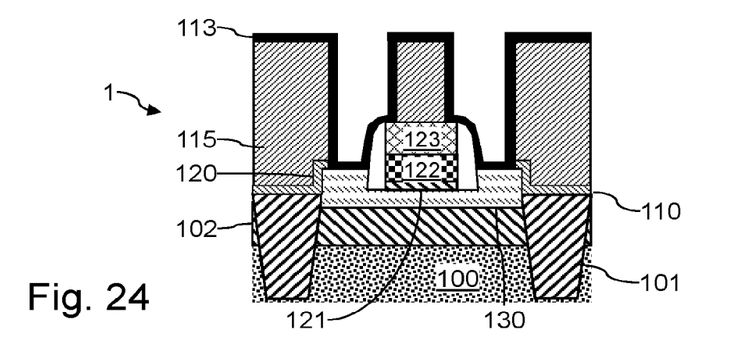

In the configuration in FIG. 24, the encapsulating layer 115 and the etch stop layer 110 have been removed plumb with the source 131, and the drain 132. This removal transfers the pattern defined by the aperture in the mask 104. The removal advantageously includes:
  a first etching step in which the encapsulating layer 115 is etched selectively over the other materials (in particular the materials of the spacers 120 and the protective insulator 123). This etching is for example anisotropic, and its properties are known per se by those skilled in the art. This etching is stopped after the encapsulating layer 115 has been removed plumb with the etch stop layer 110; and
  a second etching step in which the etch stop layer 110 is etched selectively over the other materials. This etching is for example anisotropic, and its properties are known per se by those skilled in the art. This etching is stopped after the etch stop layer 110 has been removed from the source 131, drain 132 and spacers 120. Grooves are thus formed plumb with the source 131 and drain 132, between the encapsulating layer 115 and the spacers 120.

In the configuration in FIG. 24, the mask 104 has also been removed by a process known per se. The removal of the mask 104 exposes the top face of the encapsulating layer 115.

In the configuration in FIG. 24, the electrical insulator 113 has also been formed over the entire wafer. The electrical insulator 113 thus covers the gate stack, the source 131, the drain 132 and the upper and side walls of the encapsulating layer 115. The electrical insulator 113 especially covers all the surface of the grooves formed plumb with the source 131 and drain 132.

The electrical insulator 113 may be obtained either by forming a single insulating layer, or by forming a superposition of insulating layers. The parameters to be used to form the aforementioned insulating materials 113 are known per se by those skilled in the art.

Figure 25:
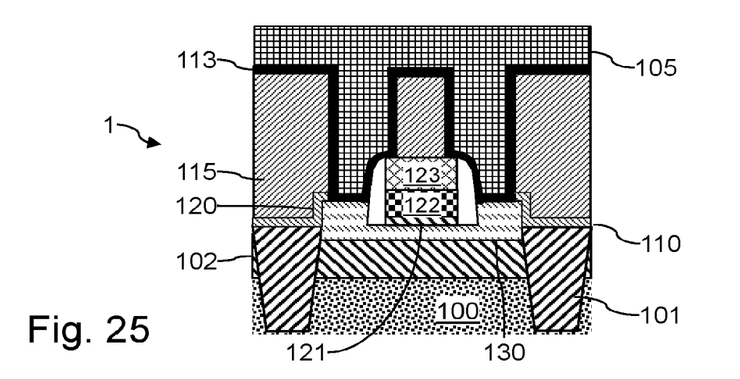

In the configuration in FIG. 25, a metal layer 105 is formed over the entire wafer in order to cover the insulator 113 and fill the grooves produced plumb with the source 131 and drain 132.

The metal layer 105 may include one layer, or a plurality of superposed layers of different metals. The one or more metals of these layers may for example be chosen from the group comprising TiN, TaN, TiAlN, W, Co or Cu.

Next, a step of removing the excess of the layer 105 and of removing a portion of the insulating layer 113 is carried out, until the upper face of the encapsulating layer 115 is exposed. This removal is typically carried out by chemical-mechanical polishing (CMP). After the removal, the layer 105 is preserved only in the trenches delimited by the insulating layer 113. The contacts 141 and 142 are thus formed. The contacts 141 and 142 obtained after this removing step may typically have a thickness comprised between 20 and 500 nm and for example of 100 nm.

The insulating layer 113 and the protective insulator 123 guarantee an absence of short-circuits between the gate electrode 122 and the contacts 141 and 142.

Interconnecting steps known per se may then be implemented to connect the contacts 141 and 142 of the transistor 1 to other circuits.

In the illustrated embodiments the semiconductor element 130 is advantageously silicon-based. The expression "silicon-based semiconductor element" is understood, in the context of the invention, to mean a semiconductor element in which the silicon concentration is at least equal to 50%.

In the illustrated embodiments, the invention is implemented both for the source and for the drain. It is also possible to envisage implementing the invention with only one metal contact placed plumb with the gate stack, only the source or drain then benefiting from a decrease in access resistance.

In the illustrated embodiments, the buried insulating layer is formed on the substrate. The invention also applies to other structures in which threshold voltage is controlled via a back gate or ground plane. In such back-gate structures:
  the buried insulating layer is an UTBOX, with a thickness typically comprised between 5 and 50 nm;
  the back gate is positioned between the substrate and the buried insulating layer and has a doping very much higher than that of the substrate; and
  the back gate may be biased to a potential different from that of the substrate.

The invention was illustrated with reference to an exemplary FDSOI transistor. The invention may of course apply to any other FDSOI transistor structure. Of course the illustrated example relates to an FDSOI transistor, the invention may also apply to any other type of transistor, for example a PDSOI transistor.

More generally, the invention applies to any type of field-effect transistor comprising a gate stack, a source, a drain and spacers. DGFET (double gate FET), TGFET (triple gate FET) and GAAFET (gate-all-around FET) architectures on bulk substrates or substrates comprising a buried oxide are therefore concerned.

In addition the invention is applicable to any type of semiconductor, for example Si, Ge, $Si_xGe_y$ and the III-Vs (InGaAs, InP, GaAs).

The invention claimed is:

1. A field-effect transistor, comprising:
   a source, drain, and channel formed in a semiconductor layer;
   a gate stack disposed above the channel and comprising a metal electrode, a first layer of electrical insulator disposed between the metal electrode and the channel, and a second layer of electrical insulator covering the metal electrode;
   a metal contact disposed plumb with the source or the drain and at least partially plumb with said gate stack; and
   a third layer of electrical insulator disposed between said metal contact and said source or said drain, said third layer of electrical insulator at least partially covering said gate stack and not extending laterally beyond an end of the source or the drain in a direction parallel to a surface of the semiconductor layer.

2. The transistor according to claim 1, wherein said gate stack includes at least one spacer disposed laterally relative to said first layer of electrical insulator, relative to said metal electrode, and relative to said second layer of electrical insulator, said metal contact and said third layer of electrical insulator being disposed at least partially plumb with said at least one spacer.

3. The transistor according to claim 1, wherein said third layer of electrical insulator at least partially covers said second layer of electrical insulator.

4. The transistor according to claim 1, wherein said third layer of electrical insulator includes two superposed films made of different materials.

5. The transistor according to claim 1, wherein said source and said drain in the semiconductor layer are not alloyed with a metal.

6. The transistor according to claim 1, wherein said third layer of electrical insulator has a thickness comprised between 0.8 nm and 3 nm from a level of contact with said source or said drain.

7. The transistor according to claim 1, further comprising:
   another metal contact disposed plumb with the other of the source or the drain, and at least partially plumb with said gate stack; and
   a fourth layer of electrical insulator disposed between said another metal contact and said other of the source or the drain, said fourth layer of electrical insulator at least partially covering said gate stack and not extending laterally beyond an end of the source or the drain in a direction parallel to a surface of the semiconductor layer.

8. A process for fabricating a field-effect transistor, comprising:
   providing an assembly comprising:
     a semiconductor layer in which a source, drain, and channel are formed:
     a gate stack disposed above the channel and comprising a metal electrode, a first layer of electrical insulator disposed between the metal electrode and the channel, and a second layer of electrical insulator covering the metal electrode; and
     a third layer of electrical insulator disposed between a metal contact and said source and said drain, said third layer of electrical insulator at least partially covering said gate stack and not extending laterally beyond an end of the source or the drain in a direction parallel to a surface of the semiconductor layer; and forming said metal contact on said third layer of electrical insulator plumb with the source or the drain and at least partially plumb with said gate stack.

9. The process according to claim 8, wherein:
said provided gate stack includes at least one spacer disposed laterally relative to said first layer of electrical insulator, relative to said metal electrode, and relative to said second layer of electrical insulator, and
said metal contact and said third layer of electrical insulator being formed at least partially plumb with said at least one spacer.

10. The process according to claim 9, further comprising:
forming a metal pad disposed laterally relative to said at least one spacer prior to forming said metal electrode, wherein the metal electrode is formed by removing a portion of the metal pad that is disposed laterally relative to said at least one spacer,
wherein the second layer of electrical insulator is formed by depositing said second layer of electrical insulator on said metal electrode.

11. The process according to claim 8, wherein:
providing said assembly further comprises providing a fourth insulating layer including a through-aperture produced plumb with the gate stack and plumb with the source and the drain, and forming grooves on either side of the gate stack and being delimited laterally by said fourth insulating layer, a bottom of said formed grooves being delimited by said source and said drain, respectively,
said third layer of electrical insulator is formed so as to cover at least the bottom of said formed grooves, and
at least a first portion of said metal contact is formed by transferring metal into at least one of said formed grooves.

12. The process according to claim 11, wherein said third layer of electrical insulator is formed so as to cover said fourth insulating layer and said gate stack, the process further comprising:
removing said third layer of electrical insulator from an upper face of the fourth insulating layer and the gate stack; and then
forming a second portion of said metal contact by transferring metal into contact with said first portion of said metal contact.

13. The process according claim 8, wherein:
providing said assembly further comprises providing a fourth insulating layer including through-apertures produced plumb with the source and the drain, respectively, and forming grooves on either side of the gate stack and being delimited laterally by said fourth insulating layer, a bottom of said formed grooves being delimited by said source and by said drain, respectively,
said third layer of electrical insulator is formed so as to cover a portion of the fourth insulating layer covering the bottom of said formed grooves and sidewalls of said formed grooves and covering at least partially the gate stack, and
said metal contact is formed by transferring metal into at least one of said formed grooves.

14. The process according to claim 13, further comprising, subsequent to said transferring metal, removing said third layer of electrical insulator from an upper face of the fourth insulating layer.

\* \* \* \* \*

UNITED STATES PATENT AND TRADEMARK OFFICE
CERTIFICATE OF CORRECTION

PATENT NO. : 9,831,319 B2  
APPLICATION NO. : 15/058615  
DATED : November 28, 2017  
INVENTOR(S) : Julien Borrel et al.

Page 1 of 1

It is certified that error appears in the above-identified patent and that said Letters Patent is hereby corrected as shown below:

In the Claims

Column 14, Line 14, please insert --to-- after "according."

Signed and Sealed this
Twenty-eighth Day of May, 2019

Andrei Iancu
*Director of the United States Patent and Trademark Office*